United States Patent
Ju et al.

(10) Patent No.: US 10,855,263 B2
(45) Date of Patent: Dec. 1, 2020

(54) MILLER CLAMP DRIVER WITH FEEDBACK BIAS CONTROL

(71) Applicant: TEXAS INSTRUMENTS INCORPORATED, Dallas, TX (US)

(72) Inventors: Shuing Ju, Santa Clara, CA (US); Wenxiao Tan, Plano, TX (US); Arun Rao, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/428,345

(22) Filed: May 31, 2019

(65) Prior Publication Data

US 2020/0044635 A1 Feb. 6, 2020

Related U.S. Application Data

(60) Provisional application No. 62/713,769, filed on Aug. 2, 2018.

(51) Int. Cl.
*H03K 4/48* (2006.01)

(52) U.S. Cl.
CPC ..................... *H03K 4/48* (2013.01)

(58) Field of Classification Search
CPC ............ H03K 4/48; H03K 4/787; H03K 4/80; H03K 4/83; H03K 4/84; H03K 17/10; H03K 17/12; H03K 19/003; H03K 25/026
USPC .......................... 327/108, 109, 110, 111, 112
See application file for complete search history.

(56) References Cited

U.S. PATENT DOCUMENTS

| | | | |
|---|---|---|---|
| 5,028,818 A | 7/1991 | Go Ang et al. | |
| 6,130,563 A | 10/2000 | Pilling et al. | |
| 9,716,430 B1 | 7/2017 | Trescases et al. | |
| 2003/0080781 A1* | 5/2003 | Curatolo | H03K 17/167 326/83 |
| 2013/0105888 A1 | 5/2013 | Zuniga et al. | |
| 2015/0381167 A1* | 12/2015 | Sicard | H02P 27/06 318/139 |

FOREIGN PATENT DOCUMENTS

WO 2017027589 A1 2/2017

OTHER PUBLICATIONS

Search Report for PCT Application No. PCT/US19/44954, date of mailing of the international search report dated Oct. 31, 2019, 1 page.

* cited by examiner

*Primary Examiner* — John W Poos
(74) *Attorney, Agent, or Firm* — Michelle F. Murray; Charles A. Brill; Frank D. Cimino

(57) ABSTRACT

Aspects provide for a circuit including a voltage supply, a driver, and a feedback bias circuit. The driver includes a first p-type field effect transistor (FET) and a first n-type FET. The voltage supply has an input and an output. The driver has a first input coupled to the voltage supply output, a second input coupled to a first node, and an output coupled to a second node. The first p-type FET has a gate coupled to the output of the driver, a source coupled to the voltage supply output, and a drain coupled to the second node. The first n-type FET has a gate coupled to the output of the second driver, a drain coupled to the second node, and a source coupled to a ground node. The feedback bias circuit has an input coupled to the second node and an output coupled to the voltage supply input.

19 Claims, 5 Drawing Sheets

MILLER CLAMP DRIVER WITH FEEDBACK BIAS CONTROL

CROSS-REFERENCE TO RELATED APPLICATIONS

The present application claims priority to U.S. Provisional Patent Application No. 62/713,769, which was filed Aug. 2, 2018, is titled "Miller Clamp Driver With Feedback Bias Control," and is hereby incorporated herein by reference in its entirety.

BACKGROUND

In some field effect transistor (FET) driver circuits, such gate driver circuits where an output of the gate driver is coupled to a gate terminal of a FET, it is desirable to control and/or minimize an amount of current flowing to the gate terminal of the FET, for example, to control a ramp rate of a gate terminal voltage of the FET. In some implementations this is done by placing a resistor in series with the gate terminal of the FET. However, in some FET driver circuits it is also desirable to rapidly control the FET (e.g., via a strong pull-up to a voltage supply or strong pull-down to a ground potential) to turn the FET on or off in a quick manner and/or strongly hold the FET in an on or off state. In some examples, this is to prevent shoot-through current or other undesirable and/or potentially damaging circumstances from occurring in the FET driver circuit. The resistor placed in series with the gate terminal of the FET, in some examples, inhibits the rapid control of the FET. A Miller Clamp is implemented, in some examples, in the FET driver circuit to compensate for the effects of the resistor in series with the gate terminal of the FET by providing an alternative path for providing a strong pull-down or strong pull-up to rapidly control the FET.

SUMMARY

At least some aspects of the present disclosure provide for a circuit. In some examples, the circuit includes a voltage supply, a driver circuit, and a feedback bias circuit. The driver circuit includes a first p-type FET and a first n-type FET. The voltage supply has an input and an output. The driver circuit has a first input coupled to the output of the voltage supply, a second input coupled to a first node, and an output coupled to a second node. The first p-type FET has a gate terminal coupled to the output of the driver circuit, a source terminal coupled to the output of the voltage supply, and a drain terminal coupled to the second node. The first n-type FET has a gate terminal coupled to the output of the second driver, a drain terminal coupled to the second node, and a source terminal coupled to a ground node. The feedback bias circuit has an input coupled to the second node and an output coupled to the input of the voltage supply.

Other aspects of the present disclosure provide for a circuit. In some examples, the circuit includes a voltage supply configured to generate an internal supply signal according to a reference voltage and a feedback signal, a driver circuit configured to drive an output node with the internal supply signal according to a received control signal, and a feedback bias circuit configured to detect an output current flowing to the output node and generate the feedback signal according to the output current. The voltage supply includes a current source, a first n-type FET, a second n-type FET, a voltage source, a resistor, and a capacitor. The current source is coupled between a first node and a second node. The first n-type FET has a gate terminal coupled to the second node, a drain terminal coupled to the first node, and a source terminal coupled to a third node. The second n-type FET has a gate terminal coupled to the second node, a drain terminal coupled to the second node, and a source terminal. The voltage source has a first terminal coupled to the source terminal of the second n-type FET and a second terminal coupled to a ground node. The resistor is coupled between the third node and the ground node. The capacitor is coupled between the third node and the ground node. The driver circuit has a first input coupled to the third node and an output coupled to the output node. The feedback bias circuit has an input coupled to the output node and an output coupled to the second node.

Other aspects of the present disclosure provide for a system. In some examples, the system includes a transistor having a gate terminal coupled to a first node and a driver coupled to the transistor and configured to drive the transistor. The driver includes an internal Miller Clamp, a FET, a pull-up circuit, a comparison circuit, and an external Miller Clamp. The internal Miller Clamp has an input and having an output coupled to the first node through a first resistor. The FET has a drain terminal coupled to the first node, a source terminal coupled to a ground node, and a gate terminal coupled to the internal Miller Clamp. The pull-up circuit is coupled to the first node through a second resistor. The comparison circuit has an input coupled to an output of the pull-up circuit and an output coupled to an input of the internal Miller Clamp. The external Miller Clamp has an input coupled to the output of the comparison circuit and an output coupled to the gate terminal of the FET. The external Miller Clamp includes a voltage supply having an input and an output, a driver circuit having a first input coupled to the output of the voltage supply, a second input coupled to a first node, and an output coupled to a second node, and a feedback bias circuit having an input coupled to the second node and an output coupled to the input of the voltage supply. The external Miller Clamp does not comprise a low dropout regulator (LDO).

BRIEF DESCRIPTION OF THE DRAWINGS

For a detailed description of various examples, reference will now be made to the accompanying drawings in which.

DETAILED DESCRIPTION

Figure 1:
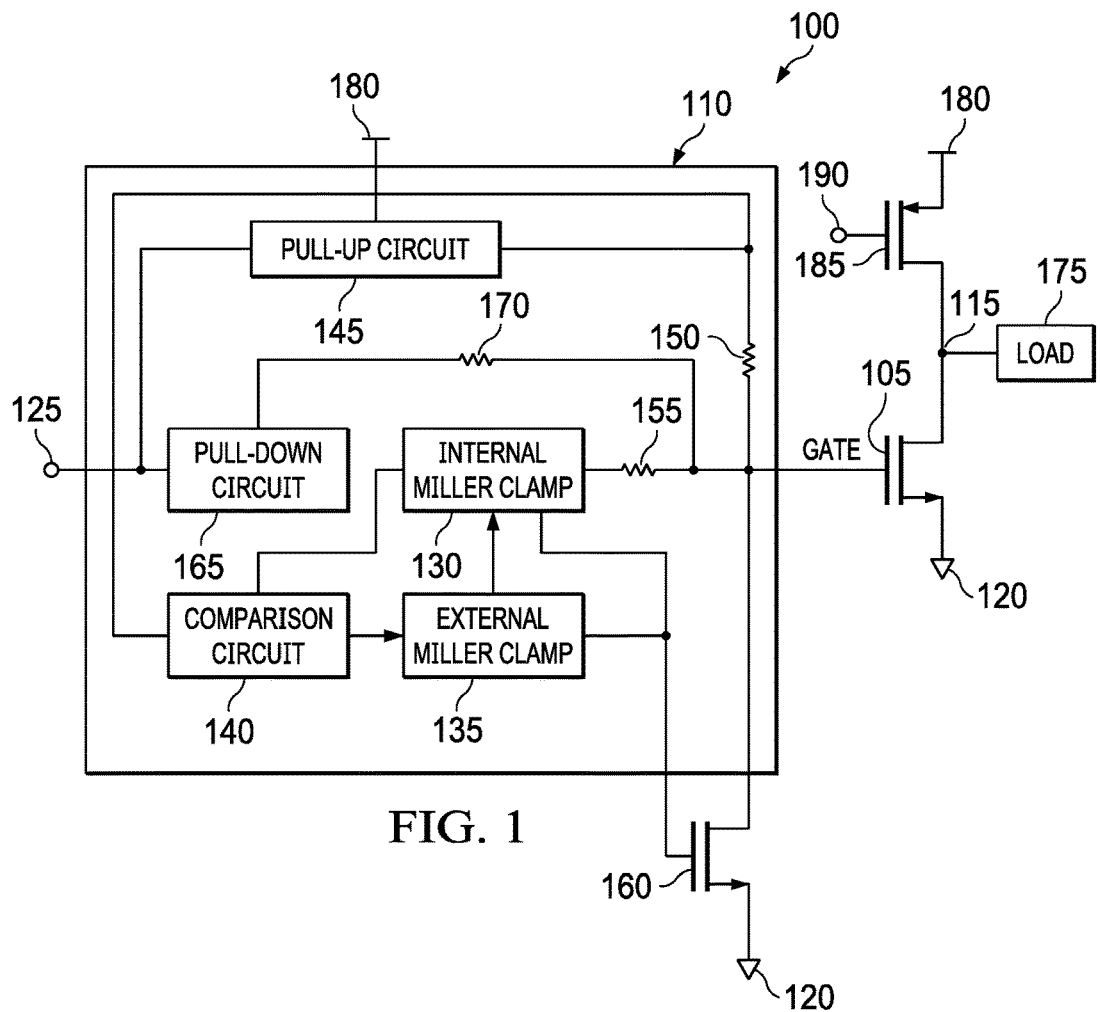
FIG. 1 shows a block diagram of an illustrative system in accordance with various examples.

A Miller Clamp implemented in a FET (e.g., an internal Miller Clamp) is often limited to a fixed strength (e.g., either pull-up strength or pull-down strength), such as sinking about 2 amps (A) to pull-down the gate terminal of the FET to a value present at a ground node, or supply voltage having a value less than zero (e.g., a negative supply voltage). To provide an alternative, more flexible strength, an external Miller Clamp can be used in place of, or in addition to, the internal Miller Clamp.

The external Miller Clamp, in some examples sources, or sinks, about 250 milliamps (mA) of current to pull-up, or pull-down, the gate terminal of the transistor. To enable the external Miller Clamp to source current, the external Miller Clamp is supplied with power, in some examples, by a voltage regulator (e.g., such as a low dropout regulator (LDO)). However, in many implementations, a LDO includes an output capacitor to hold a supply voltage provided by the LDO. The output capacitor is, in many implementations, comparatively large in capacitance and therefore comparatively large in silicon die area consumed by the output capacitor. Alternatively, an external capacitor can be coupled to the LDO via an external pin of the FET driver. However, both options for providing the LDO with the output capacitor undesirably increase a size and cost of the FET driver.

Additionally, in some examples, such as the presence of comparatively large loads (e.g., having a capacitance of 1 nanofarads (nF) or greater) the 250 mA sink strength of the external Miller Clamp is insufficient to rapidly pull-down the gate terminal of the transistor in a period of time sufficiently short to prevent formation of a shoot-through path through which the shoot-through current discussed above may flow. In such examples, in some circumstances, the internal Miller Clamp supplements the external Miller Clamp to increase a pull-down strength exerted on the gate terminal of the transistor. Supplementing the internal Miller Clamp with the external Miller Clamp and vice versa, in at least some examples, compensates for shortcomings of each individual type of Miller Clamp at a reduced component size (e.g., silicon die surface area consumed), lower power, and/or lower cost that modifying either the internal Miller Clamp or the external Miller Clamp to compensate for the shortcomings without supplementation of the other.

At least some examples of the present disclosure provide for a circuit. In at least some examples, the circuit is a driver suitable for driving a gate terminal of a transistor. In some examples, the transistor is a silicon-carbide (SiC) FET. In other examples, the transistor is an insulated gate bi-polar transistor (IGBT). The circuit includes, in some examples, an internal Miller Clamp and an external Miller Clamp. The external Miller Clamp, in some examples, is not powered by a LDO, but instead includes a voltage supply that generates a voltage supply based on a current feedback scheme that senses and feeds back an output current of the external Miller Clamp. In at least some examples, a transient response time of the current feedback scheme disclosed herein is sufficiently fast as to mitigate a need for a large holding capacitor, such as would be present to compensate for loop delay in implementations in which an LDO is used as a power supply of the external Miller Clamp. Accordingly, in at least some examples, the external Miller Clamp is expressly not powered by a LDO. In at least some examples, although the external Miller Clamp is not powered by an LDO, the external Miller Clamp receives a reference voltage that may be generated by an LDO or other component(s) not included within the external Miller Clamp and received by the external Miller Clamp from the LDO or other component(s). In yet other examples, the LDO or other component(s) that generate the reference voltage are included in the external Miller Clamp but do not power the external Miller Clamp (e.g., are not a source voltage for components of the external Miller Clamp, do not drive an output of the external Miller Clamp, etc.

Additionally, in at least some examples, the external Miller Clamp is supplemented by the internal Miller Clamp to sink current from a node to which the external Miller Clamp and the internal Miller Clamp are each coupled (e.g., such as a gate terminal of a transistor) to increase a current sinking capacity with which current is sunk from the node. For example, in some implementations the internal Miller Clamp has a capability of sinking a greater amount of current than the external Miller Clamp. In at least some examples, to assist or supplement the external Miller Clamp in sinking current from the node (e.g., such as to pull the node below a threshold and turn off a transistor having a gate terminal coupled to the node), the internal Miller Clamp activates in parallel with the external Miller Clamp, sinking current from the node. In at least some examples, the internal Miller Clamp sinking current from the node in parallel with the external Miller Clamp decreases an amount of time consumed in pulling the node below a threshold for turning off a transistor having a gate terminal coupled to the node, causing the transistor to more rapidly turn off and, in some examples, preventing the formation of a shoot-through path in the circuit.

Turning now to FIG. 1, a block diagram of an illustrative system 100 is shown. In at least some examples, the system 100 is a system including a power FET 105 and a driver 110. The power FET 105, in some examples, is a SiC FET, while in other examples the power FET 105 is not a FET but is instead representative of an IGBT. The power FET 105, in at least some examples, switches a signal received at a drain terminal of the power FET 105 from a node 115 to a source terminal of the power FET 105 that is coupled to a ground terminal 120. In at least some examples, the driver 110 has an output coupled to a gate terminal of the power FET 105 and an input coupled to a node 125. In some examples, the driver 110 receives a control signal (e.g., such as a pulse-width modulation (PWM) signal) at the node 125 for use in controlling the power FET 105 via one or more of the components of the driver 110. The node 115, in at least some examples, couples to a load 175, as well as a drain terminal of a FET 185 having a source terminal coupled to a the voltage source 180 and a gate terminal coupled to a node 190. In other examples, the FET 185 is omitted and instead replaced with a free-wheel diode pair and inductor in series between the node 115 and a voltage source 180. In yet other examples, one or more additional, or alternative, components are positioned in the system 100 in series and/or parallel between the node 115 and the voltage source 180. In some examples, the node 190 is coupled to the gate terminal of the power FET 105 such that a same signal is present at both the node 190 and the gate terminal of the power FET 105. In other examples, the node 190 receives another signal, such as an output of another driver substantially similar to the driver 110, a pulse-width modulator, or any other suitable circuit or component capable of generating a control signal for controlling the FET 185.

In some examples, the driver 110 includes an internal Miller Clamp 130, an external Miller Clamp 135, comparison circuit 140, a pull-up circuit 145, and a pull-down circuit 165. The comparison circuit 140 includes at least a comparator (not shown) that compares an output of the pull-up circuit 145 to a threshold voltage Vclamp and, based on a result of that comparison, controls the internal Miller Clamp 130 and/or the external Miller Clamp 135. In at least some examples, the comparison circuit 140 compares the output of the pull-up circuit 145 to Vclamp when GATE is being pulled low (e.g., being discharged) such that the output of the pull-up circuit 145 is approximately equal in value (e.g., voltage) to GATE (e.g., because no current is sunk or sourced from the pull-up circuit 145 when GATE is being pulled low). The pull-up circuit 145, in at least some examples, is coupled to the gate terminal of the power FET 105 through a resistor 150. The internal Miller Clamp 130 is, in some examples, coupled to the gate terminal of the power FET 105 through a resistor 155. The external Miller Clamp 135 is, in some examples, configured to couple to a gate terminal of a FET 160 that has a drain terminal coupled to the gate terminal of the power FET 105 and a source terminal coupled to the ground terminal 120. In other examples, the source terminal of the FET 160 is coupled to a node (not shown) other than the ground terminal 120, where the node receives a supply voltage having a value less than zero, such as a negative supply. In at least some examples, the internal Miller Clamp 130 further has another output coupled to the gate terminal of the FET 160, for example, for use in supplementing control by the external Miller Clamp 135 in controlling the FET 160. The external Miller Clamp 135, although included as a component of, and within, the driver 110, is referred to as external because of its configuration to couple to and control the FET 160, which is external to the driver 110, for sinking current from the gate terminal of the power FET 105.

In an example of operation of the system 100, the driver 110 controls operation of the power FET 105 by controlling a signal (GATE) provided to the gate terminal of the power FET 105. When the signal present at the gate terminal of the power FET 105 has a value sufficiently larger than a value of a signal present at the source terminal of the power FET 105, the power FET 105 begins conducting between its drain and source terminals. When the value of GATE is not sufficiently larger than the signal present at the source terminal of the power FET 105, the power FET 105 ceases, or does not begin, conducting between its drain and source terminals. The driver 110 performs the control, in some examples, at least partially according to the control signal received at the node 125. For example, when the control signal has a logical high value, the pull-up circuit 145 generates a signal having a voltage sufficiently large to cause the power FET 105 to conduct between its drain and source terminals. The signal is provided to the power FET 105 by the pull-up circuit 145, in at least some examples, through the resistor 150. The resistor 150, in at least some examples, limits an amount of current received at the gate terminal of the power FET 105 as a result of the signal generated by the pull-up circuit 145 and/or any other component of the driver 110.

When the control signal received at the node 125 transitions to a logical low level, the pull-up circuit 145 turns off and ceases asserting GATE as VDD. Also when the control signal received at the node 125 transitions to the logical low level, the pull-down circuit 165 activates, pulling the gate terminal of the power FET 105 low to discharge GATE and turn off the power FET 105. The pull-down circuit 165 pulls the gate terminal of the power FET 105 low by coupling the gate terminal of the power FET 105 to the ground terminal 120 through one or more devices, such as a resistor 170 and/or one or more transistors of the pull-down circuit 165.

When a value of the output of the pull-up circuit 145 becomes less than Vclamp, the comparison circuit 140 controls the external Miller Clamp 135 to rapidly discharge a remaining charge of GATE. The external Miller Clamp 135 rapidly discharges the remaining charge of GATE by, in some examples, controlling the FET 160 to conduct between its drain and source terminals, electrically coupling the gate terminal of the power FET 105 to the ground terminal 120 without an intervening resistor in an electrical path formed between the gate terminal of the power FET 105 and the ground terminal 120 through the FET 160. To control the FET 160, the external Miller Clamp 135 sources a signal to the gate terminal of the FET 160 to cause the FET 160 to turn on and conduct between the drain and source terminals of the FET 160. However, in at least some examples, the external Miller Clamp 135 does not include an LDO.

To provide a regulated power supply without including an LDO, to at least gain the advantages discussed above that accompany a lack of an LDO, the external Miller Clamp 135 includes a feedback path (not shown) that generates an internal supply signal. For example, a sense FET (not shown) of the feedback path generates a sense current representative of an output current of the external Miller Clamp 135 and feeds the sense current through the feedback path to generate a voltage signal that is fed to an internal voltage supply (not shown) that generates the internal supply signal. The internal voltage supply, in at least some examples, is a level-shifter circuit (not shown) that generates the internal supply signal based on the sense current and VDD of the system 100. In at least some examples, the internal supply signal has a value of about 5 volts (V). The internal supply signal, based at least on its dependence on the sense current of the external Miller Clamp 135 and a response time of the feedback path and internal voltage supply, is more stable and has lower undershoot, as well as faster response to transient signal changes, as compared to an LDO output, and therefore a capacitor (not shown) implemented to maintain a value of the internal supply signal for driving the FET 160 has a smaller capacitance value, and correspondingly smaller physical size, than in systems implementing an LDO to generate a supply signal.

Additionally, in at least some examples, a current sinking capacity of the external Miller Clamp 135 is less than a current sinking capacity of the internal Miller Clamp 130. When the FET 160 has a gate capacitance of about 1 nF or greater, or the external Miller Clamp 135 is coupled to another load that has a capacitance of about 1 nF or greater, in some examples the current sinking capacity of the external Miller Clamp 135 is insufficient to turn off the FET 160 (e.g., pull the gate terminal of the FET 160 low so that a gate to source voltage (Vgs) of the FET 160 is less than a Vgs threshold) in a timely manner. For example, the current sinking capacity of the external Miller Clamp 135 may be insufficient to turn off the FET 160 prior to the pull-up circuit 145 activating to turn on the power FET 105, causing a shoot-through path to form from the voltage source 180 through the pull-up circuit 145 and the FET 160 to the ground terminal 120. The shoot-through path is, in at least some examples, undesirable because of a resulting comparatively large amount of current that flows through the comparatively low resistance shoot-through path, potentially damaging the gate terminal of the power FET 105, the FET 160, and/or any one or more other components or circuits of the driver 110.

Figure 2:
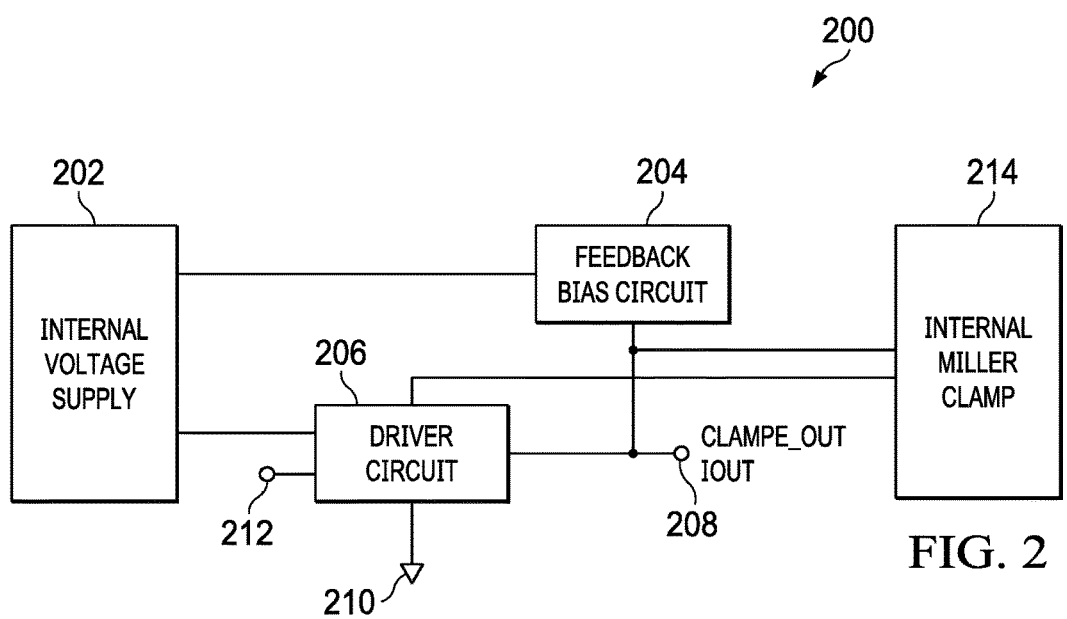
FIG. 2 shows a block diagram of an illustrative circuit in accordance with various examples.

To prevent formation of the shoot-through path, in at least some examples, the internal Miller Clamp 130 is configured to supplement operation of the external Miller Clamp 135, activating to sink current from the gate terminal of the FET 160 to the ground terminal 120 in parallel with the external Miller Clamp 135. In at least some examples, the internal Miller Clamp 130 supplementing the external Miller Clamp 135 discharging the gate terminal of the FET 160 discharges the gate terminal of the FET 160 more rapidly than the external Miller Clamp 135 would be capable of when operating alone, thereby turning off the FET 160 more rapidly than the external Miller Clamp 135 is capable of alone and preventing formation of the shoot-through path. The internal Miller Clamp 130 is controlled to supplement operation of the external Miller Clamp 135, in some examples, based on a control signal sent by the external Miller Clamp 135 to the internal Miller Clamp 130. The control signal is, in some examples, output by the external Miller Clamp 135 in response to a register bit of the external Miller Clamp 135 being set when the external Miller Clamp 135, or another component (not shown), determines that a pull-down strength of the external Miller Clamp 135 is insufficient to discharge the gate terminal of the FET 160 within a desired and/or predefined period of time Turning now to FIG. 2, a block diagram of an illustrative circuit 200 is shown. In at least some examples, the circuit 200 is an external Miller Clamp suitable for implementation as the external Miller Clamp 135 of the driver 110 of the system 100 of FIG. 1. In other examples, the circuit 200 is suitable for implementation as a pull-down driver or other component in any other suitable system, or as a standalone circuit or component configured to couple to one or more other components, circuits, or devices. The circuit 200, in some examples, includes an internal voltage supply 202, a feedback bias circuit 204, and a driver circuit 206.

In at least some examples, the internal voltage supply 202 is coupled to, and configured to receive an input from, the feedback bias circuit 204, and is coupled to, and configured to provide an output to, the driver circuit 206. The feedback bias circuit 204 is coupled to, and configured to monitor a signal of, the driver circuit 206.

In at least one example, the internal voltage supply 202 is configured to receive an input signal from the feedback bias circuit 204. The input signal is, in at least some examples, representative of an output current (IOUT) of the circuit 200 (e.g., as output by the driver circuit 206 at a node 208. For example, the input signal is a scaled representation of IOUT, as generated by the feedback bias circuit 204 based at least partially on IOUT. Based on the received input signal, the internal voltage supply 202 generates an internal supply signal. The internal supply signal, in some examples, has a value of about 5 V. In other examples, the internal supply signal has any other suitable value.

In at least some examples, the internal voltage supply 202 generates the internal supply signal without the use of a LDO, reducing a physical size of a component including the circuit 200 as compared to a component including a circuit substantially similar to the circuit 200 but implementing an LDO as, or as an element of, the internal voltage supply 202. In at least some examples, the space savings is approximately 0.36 square millimeters of silicon die area. Further, in at least some examples, implementing the internal voltage supply 202 without the use of an LDO reduces quiescent current consumption of the circuit 200 by about 100 microamps as compared to a component including a circuit substantially similar to the circuit 200 but implementing an LDO as, or as an element of, the internal voltage supply 202.

For example, in some implementations the internal voltage supply generates the internal supply signal based on a level-shifting scheme. For example, a reference signal is modulated based on the input signal received by the internal voltage supply 202 to generate the internal supply signal. The reference signal, in at least some examples, has a value greater than a designed value of the internal supply signal, and the value of the reference signal is reduced, based on the input signal received by the internal voltage supply 202, by a level-shifter of the internal voltage supply 202 to generate the internal supply signal.

The driver circuit 206 is configured to drive the node 208 with a signal CLAMPE_OUT having a current IOUT, pulling the node 208 high to approximately a value of the internal supply signal or pulling the node 208 low to approximately a value present at a ground node 210 or a node (not shown) that receives a supply voltage having a value less than zero. In at least some examples, the driver circuit 206 is configured to receive an input at a node 212 to control the driving by the driver circuit. For example, when a signal having a first value (or a signal having a first value with respect to a threshold value) is received at the node 212, the driver circuit 206 drives the node 208 by asserting the internal supply signal (minus, in some examples, any loss in value associated with handling of the internal supply signal by the driver circuit 206) at the node 208. When a signal having a second value (or a signal having a second value with respect to a threshold value) is received at the node 212, the driver circuit 206 drives the node 208 by asserting a value present at the ground node 210 at the node 208 (e.g., coupling the node 208 to the ground node 210 through one or more components to discharge the node 208). In at least some examples, the driver circuit 206 includes one or more pre-drivers (not shown) and a push-pull pair of transistors (not shown) for driving the node 208. In other examples, the driver circuit 206 includes only the push-pull pair of transistors and not the pre-drivers. In yet other examples, the driver circuit 206 includes any one or more components suitable for use in driving the node 208 with the internal supply signal and/or discharging the node 208 to the ground node 210.

In at least some examples, the circuit 200 is configured to couple to an internal Miller Clamp 214 at the node 208. The internal Miller Clamp 214, in some examples, supplements operation of the circuit 200. For example, in operational circumstances in which a pull-down strength of the driver circuit 206 is insufficient to discharge the node 208 to the ground node 210 within a desired and/or predefined period of time (e.g., such as a period of time sufficiently short as to prevent formation of a shoot-through current path in a device implementing the circuit 200), the internal Miller Clamp 214 supplements operation of the circuit 200. The internal Miller Clamp 214 supplementing operation of the circuit 200, in at least some examples, increases a pull-down strength exerted at the node 208, discharging the node 208 more rapidly than the circuit 200 operating alone without the aid of the internal Miller Clamp 214. In at least some examples, the circuit 200 and the internal Miller Clamp 214 operating in parallel to discharge the node 208 prevents formation of a shoot-through current path in a device implementing the circuit 200 and the internal Miller Clamp 214. The internal Miller Clamp 214, in at least some examples, includes a LDO (not shown) for driving at least one component of the internal Miller Clamp 214, unlike the circuit 200 which does not include an LDO. In at least some examples, the internal Miller Clamp 214 and the circuit 200 are implemented on a same die, in a same chip, etc. In other examples, the internal Miller Clamp 214 and the circuit 200 are implemented on separate dies, as separate chips, etc. and configured to couple together to perform the functions ascribed them herein.

The feedback bias circuit 204 is configured to monitor the node 208 to generate a feedback signal for providing to the internal voltage supply 202 as the input signal to the internal voltage supply 202. In at least some examples, the feedback bias circuit 204 monitors the node 208 via one or more sense components configured to sense a value of IOUT. In at least some examples, the sense component is a sense FET (not shown). Based on the value of IOUT, the feedback bias circuit 204 generates a feedback signal and provides the feedback signal to the internal voltage supply 202. In at least some examples, the feedback signal has a value proportional to, but not equal to, the value of IOUT. For example, in at least some implementations the feedback signal is a scaled representation of IOUT. In some examples, the sense FET scales IOUT for generation as the feedback signal. For example, when a channel size of the sense FET is less than a channel size of a transistor (not shown) through which IOUT flows to reach the node 208, a current flowing through the sense FET is a scaled representation of IOUT. In some examples, the current flowing through the sense FET is provided to the internal voltage supply 202 as the feedback signal. In other examples, the current flowing through the sense FET is mirrored by the feedback bias circuit 204 (e.g., such as via a current mirror (not shown)) to the internal voltage supply 202. Mirroring the current flowing through the sense FET, in at least some examples, further scales the current flowing through the sense FET with respect to IOUT.

Figure 3:
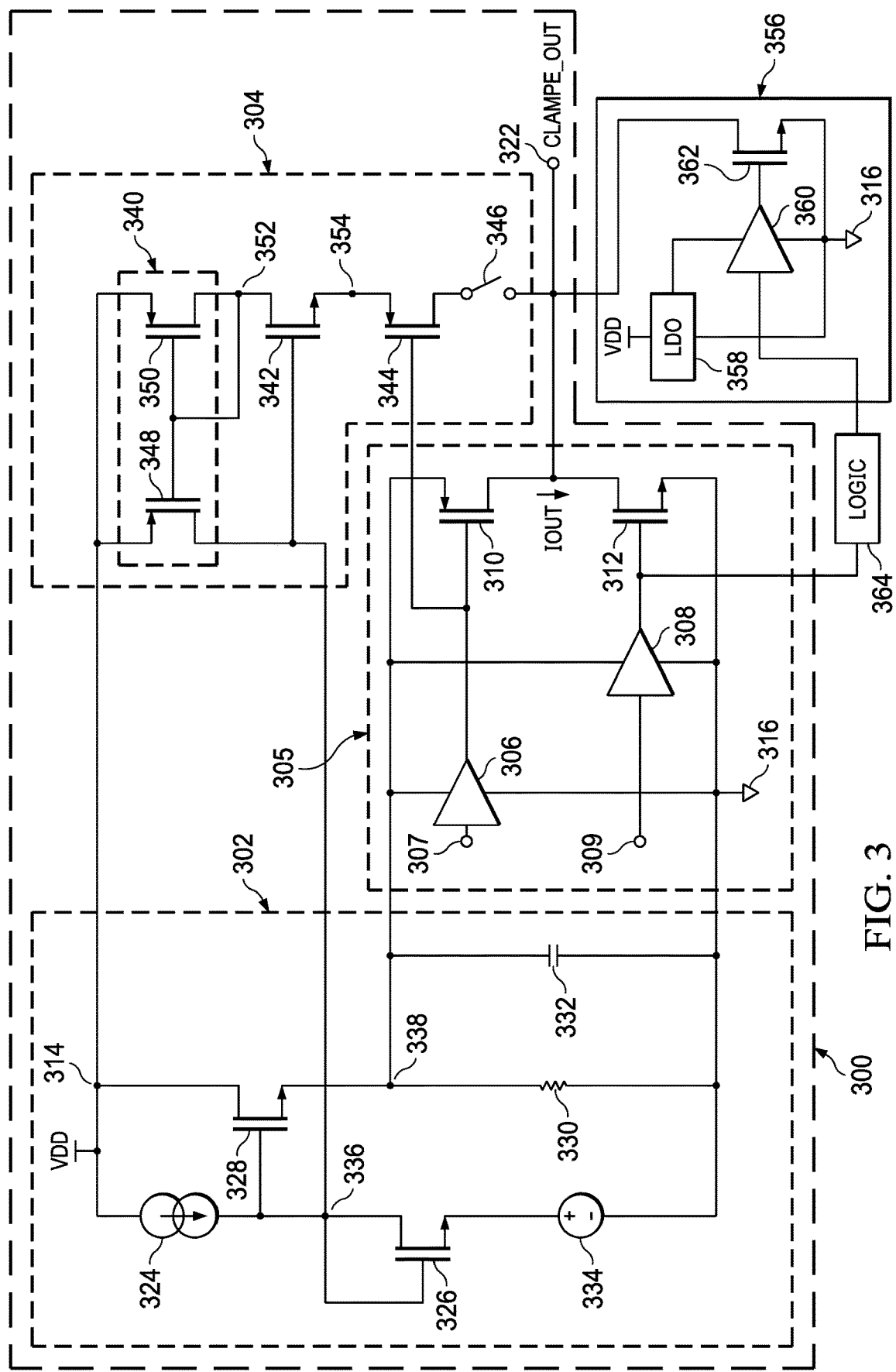
FIG. 3 shows a schematic diagram of an illustrative circuit in accordance with various examples.

Turning now to FIG. 3, a schematic diagram of an illustrative circuit 300 is shown. In at least some examples, the circuit 300 is an external Miller Clamp suitable for implementation as the external Miller Clamp 135 of the driver 110 of the system 100 of FIG. 1. In other examples, the circuit 300 is suitable for implementation as a pull-down driver or other component in any other suitable system, or as a standalone circuit or component configured to couple to one or more other components, circuits, or devices. The circuit 300, in some examples, includes an internal voltage supply 302, a feedback bias circuit 304, and a driver circuit 305 that includes a driver 306, a driver 308, a FET 310, and a FET 312. In at least some examples, the internal voltage supply 302 is implemented as a level-shifter configured to modulate a reference voltage based on the feedback signal, output by the feedback bias circuit 304 by shifting a value of the reference voltage based on the feedback signal to generate an internal supply signal as an output of the internal voltage supply 302.

The internal voltage supply 302 is coupled to a power node 314, a ground node (or node that receives a supply voltage having a value less than zero) 316, a node 336, and a node 338. In at least some examples, the internal voltage supply 302 receives an input signal (e.g., a feedback signal generated at least partially according to a sense current based on IOUT of the circuit 300) at the node 336 and provide an output signal (e.g., an internal supply signal) at the node 338. The FET 310 has a source terminal coupled to the node 338, a drain terminal coupled to a node 322, and a gate terminal coupled to an output of the driver 306. In at least some examples, the FET 310 is a p-type FET. The FET 312 has a drain terminal coupled to the node 322, a source terminal coupled to the ground node 316, and a gate terminal coupled to an output of the driver 308. In at least some examples, the FET 312 is a n-type FET. The driver 306 has an input coupled to a node 307, a supply terminal coupled to the node 338, a ground terminal coupled to the ground node 316, and an output coupled to the gate terminal of the FET 310. In at least some examples, the node 307 is configured to receive a comparison result, such as from the comparison circuit 140 of the system 100 when the circuit 300 is implemented as the external Miller Clamp 135. The driver 308 has an input coupled to a node 309, a supply terminal coupled to the node 338, a ground terminal coupled to the ground node 316, and an output coupled to the gate terminal of the FET 312. In at least some examples, the node 309 is configured to receive a comparison result, such as from the comparison circuit 140 of the system 100 when the circuit 300 is implemented as the external Miller Clamp 135. For example, when the circuit 300 is implemented as the external Miller Clamp 135 of the circuit 100 of FIG. 1, the node 307 and the node 309 are each coupled to, and configured to receive an output of, the comparison circuit 140. In at least some examples, both the driver 306 and the driver 308 receive a same output (e.g., comparison result) of the comparison circuit 140. In other examples, the driver 306 and the driver 308 receive different outputs (e.g., comparison results) of the comparison circuit 140. Additionally, when the circuit 300 is implemented as the external Miller Clamp 135, the node 322 corresponds to an output of the internal Miller Clamp 135 that coupled to the gate terminal of the FET 160.

The internal voltage supply 302, in at least some examples, includes a current source 324, a FET 326, a FET 328, a resistor 330, a capacitor 332, and a reference voltage source 334. The current source 324 is coupled between the power node 314 and a node 336. The FET 326 has a gate terminal coupled to the node 336, a drain terminal coupled to the node 336, and a source terminal. The FET 328 has a gate terminal coupled to the node 336, a drain terminal coupled to the node 314, and a source terminal coupled to a node 338. The resistor 330 is coupled between the node 338 and the ground node 316. The capacitor 332 is coupled between the node 338 and the ground node 316. The reference voltage source 334 is coupled between the source terminal of the FET 326 and the ground node 316.

The feedback bias circuit 304, in a least some examples, includes a current mirror 340, a FET 342, a FET 344, and a switch 346. The current mirror 340, in at least some examples, includes a FET 348 and a FET 350. The FET 342 is, in at least some examples, n-type. The FET 344, the FET 348 and the FET 350 are, in at least some examples, p-type. The FET 342 has a gate terminal coupled to the node 336, a source terminal coupled to a node 354, and a drain terminal coupled to a node 352, and in at least some examples, increases accuracy of current sensed by the FET 344 at the node 322 (e.g., by controlling a voltage present at the node 354 such that, at steady-state, Vgs of the FET 344 is approximately equal to Vgs of the FET 310). The FET 344 has a gate terminal coupled to the output of the driver 306, a source terminal coupled to the node 354, and a drain terminal coupled to the node 322 through the switch 346. The switch 346 is any controllable device suitable for selectively coupling a terminal of the FET 344 to the node 322. In at least some examples, the switch 346 is omitted from the feedback bias circuit 304. The FET 348 has a gate terminal coupled to the node 352, a source terminal coupled to the node 314, and a drain terminal coupled to the node 336. The FET 350 has a gate terminal coupled to the node 352, a source terminal coupled to the node 314, and a drain terminal coupled to the node 352. The current mirror 340 is configured to substantially mirror, via the FET 348 and the FET 350, current flowing through the FET 344 to the node 336 at a ratio m1 (e.g., where m1 multiplied by a value of the current flowing through the FET 344 substantially equals a value of the current flowing from the feedback bias circuit 304 to the node 336) to provide the mirrored current to the internal voltage supply 302 as an input signal. In at least some examples, m1 is determined according to a size ratio of the FET 348 to the FET 350, such as a ration of channel widths and/or channel lengths of the FET 348 and the FET 350. The FET 344 has a size determined at least partially according to a size of the FET 310 such that a current flowing through the FET 344 is proportional to, but less than, IOUT flowing through the FET 310. In this regard, the FET 344 can, in some examples, be referred to as a sense FET that senses IOUT and/or senses a current flowing through the FET 310.

In an example of operation, the internal voltage supply 302 receives an input signal at the node 336 from the feedback bias circuit 304. The input signal is, in some examples, a signal having a current representative of IOUT (e.g., such as IOUT divided by value K, for example, where K is determined according to a current mirror or other transistor ratio). The reference voltage source 334 in at least some examples, generates a reference voltage (VREF) having a value approximately equal to 5 V. Vgs of the FET 326, in at least some examples, is proportional to a square root of IOUT divided by K, where K is approximately equal to a size (e.g., such as transistor channel width to length ratio) of the FET 310 multiplied by a size (e.g., such as transistor channel width to length ratio) of the FET 312 multiplied by m1. As IOUT increases, Vgs of the FET 326 also increases, increasing a difference between a voltage present at the node 336 and a voltage present at the node 338. The difference in voltages present at the node 336 and the node 338 determines a drive strength of the FET 328 driving the node 338 and a voltage of the signal present at the node 338.

In at least some examples, the FET 326 and the FET 328 together form a level-shifter that shifts a level of a signal present at the node 336 to provide a signal at the node 338. A peak drive strength of the level-shifter, in at least some examples, is approximately equal to K multiplied by a size (e.g., such as transistor channel width to length ratio) of the FET 328 divided by a size (e.g., such as transistor channel width to length ratio) of the FET 326. In at least some examples, K is designed such that K is greater than the size of the FET 326 divided by the size of the FET 328 and a loop gain of the circuit 300 is less than one. When the loop gain of the circuit 300 is less than one, in at least some examples a compensation circuit (e.g., such as might be implemented at the node 336 in some circuit implementations) is not included in the circuit 300. When a compensation circuit is not included in the circuit 300, a low frequency pole resulting from the compensation circuit is not inserted into the circuit 300. In the absence of the low frequency pole, a transient response of the circuit 300 (e.g., a response in a value of a signal at the node 336 in response to a change in value of IOUT at the node 322) is improved as compared to a circuit including the compensation circuit and/or a circuit in which an LDO generates a voltage present at the node 338 instead of the internal voltage supply 302 generating the voltage present at the node 338, as described herein. When the transient response of the circuit 300 is improved (e.g., reduced in duration) as detailed above, a capacitance, and therefore physical size, of the capacitor 332 is reduced as compared to a capacitance and physical size of a capacitor in a circuit having a slower transient response and/or implementing an LDO. The reduced capacitance and physical size of the capacitor 332 facilitates a reduction in size of the circuit 300 compared to other driver circuits that implement an LDO with an internal capacitor larger in size than the capacitor 332 or an externally accessible pin for coupling to a capacitor larger in size than the capacitor 332. For example, at least some implementations of the circuit 300 are reduced in size by approximately 0.36 square millimeters and have a current consumption reduced by about 100 microamps when compared to an external Miller Clamp circuit that includes an LDO for supplying a driver of the external Miller Clamp.

As discussed above, in at least some examples a pull-down strength of the circuit 300 (e.g., such as a strength with which the node 322 can be discharged to the ground node 316) is insufficient to meet one or more time thresholds. For example, in at least some implementations, the insufficient pull-down strength results in the formation of a shoot-through path in a device or system implementing and/or including the circuit 300. In at least some examples, an internal Miller Clamp 356 is coupled to the node 322 and configured to activate to pull down (e.g., discharge) the node 322 in parallel with the circuit 300 to decrease an amount of time consumed in discharging the node 322, thereby preventing the formation of the shoot-through path. The internal Miller Clamp 356, in at least some examples, includes a LDO 358 for driving at least one component of the internal Miller Clamp 356, unlike the circuit 300 which does not include an LDO. The internal Miller Clamp 356 further includes a driver 260 and a FET 362. In at least some examples, the LDO is configured to generate a supply signal for powering the driver 360 based on VDD. The driver 360 drives the FET 362 sink current from the node 322. In some examples, the drain terminal of the FET 362 is coupled to the node 322, while in other examples the drain terminal of the FET 362 is coupled to the node 322 via a switch 366 that is configured tor receive, and be controlled by, a control signal received from any suitable source (e.g., such as logic circuit or component, processor, etc.). In at least some examples, the internal Miller Clamp 356 and the circuit 300 are implemented on a same die, in a same chip, etc. In other examples, the internal Miller Clamp 356 and the circuit 300 are implemented on separate dies, as separate chips, etc. and configured to couple together to perform the functions ascribed them herein.

As discussed above, in some examples the internal Miller Clamp 356 supplements operation of the circuit 300 in pulling-down the node 322 during some periods of operation, but not during others. To control the internal Miller Clamp 356, in at least some examples, a logic circuit 364 monitors an output of the driver 308 and, based on the output of the driver 308, controls the driver 360. The logic circuit 364, in at least some examples, is a component of the internal Miller Clamp 356. In other examples, the logic circuit 364 is a component of the circuit 300. In yet other examples, the logic circuit 364 is neither a component of the circuit 300 nor the internal Miller Clamp 356, but is instead configured to couple to the circuit 300 and the internal Miller Clamp 356.

Figure 4:
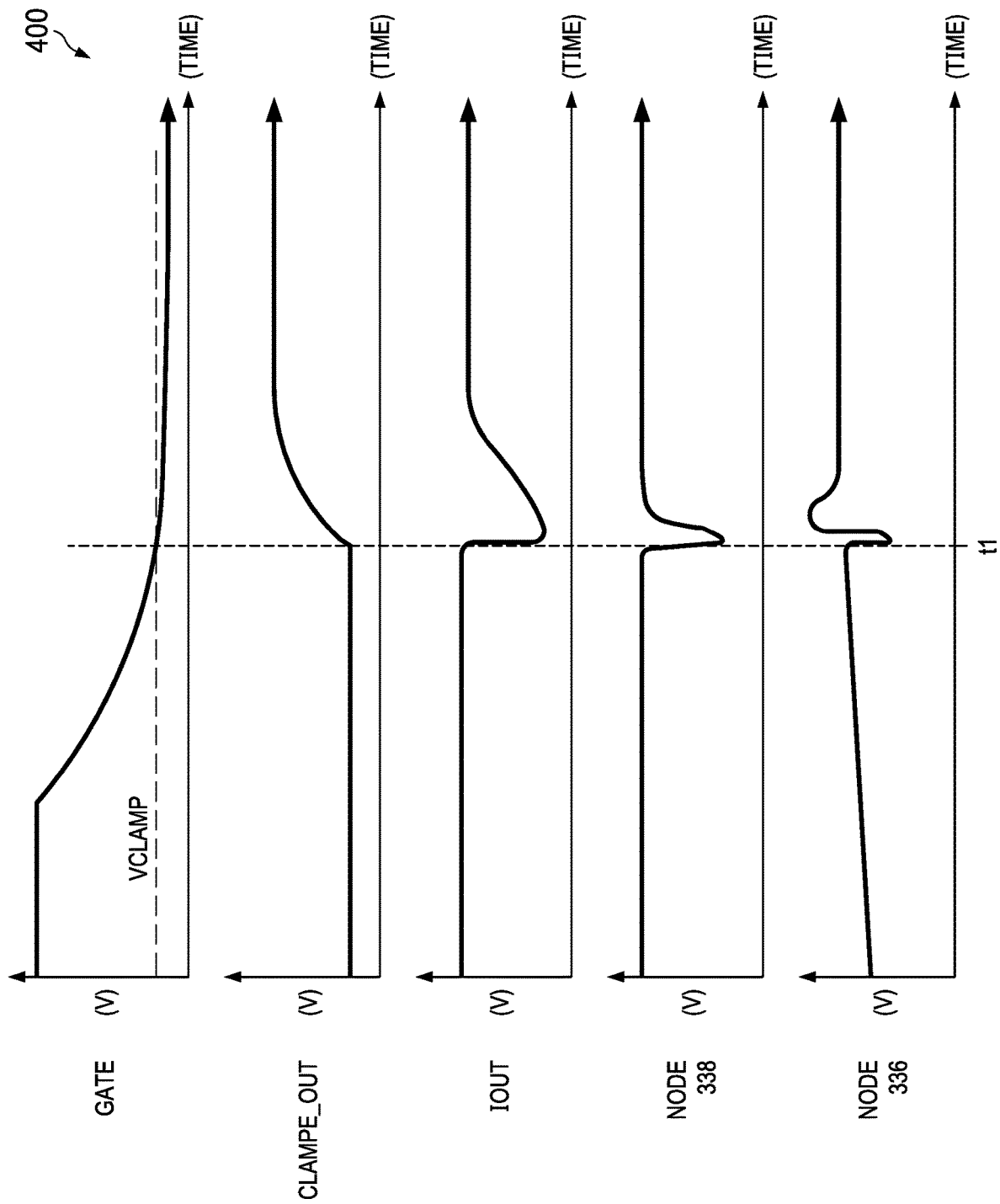
FIG. 4 shows a diagram of illustrative signal waveforms in accordance with various examples.

Turning now to FIG. 4, a diagram 400 of illustrative signal waveforms is shown. In at least some examples, the diagram 400 is representative of signals present in one or more of the system 100 of FIG. 1, circuit 200 of FIG. 2, and/or circuit 300 of FIG. 3. For example, the diagram 400 includes the signal GATE of the system 100, a signal CLAMPE_OUT, representative of a voltage of a signal present at the node 208 of the circuit 200 and/or the node 322 of the circuit 300, IOUT, as discussed with respect to various figures described herein, a voltage present at the node 338 of the circuit 300, and a voltage present at the node 336 of the circuit 300. As shown in the diagram 400, GATE, CLAMPE-_OUT, the voltage present at the node 338, and the voltage present at the node 336 are each represented along a vertical axis representative of voltage and a horizontal axis representative of time, and IOUT is represented along a vertical axis representative of current and a horizontal axis representative of time.

As shown by the diagram 400, at a time t1 at which GATE falls below a threshold value Vclamp (e.g., as discussed above with respect to various figures described herein), the circuit 200 and/or circuit 300 activates, and begins sourcing IOUT (e.g., to the node 208 or the node 322, respectively), increasing a value of CLAMPE_OUT. Beginning at t1, each of IOUT, the voltage at the node 336, and the voltage at the node 338 experience a drop in value (e.g., such as due to capacitive coupling of a gate-to-source capacitance of the FET 328 causing a drop in voltage at the node 336 and/or a current pull of IOUT causing a drop in voltage at the node 338) to a value determined at least partially according to a capacitance of a component coupled to the node 322 and configured to receive CLAMPE_OUT. In at least some examples, a duration of time until the IOUT, the voltage at the node 336, and the voltage at the node 338 substantially recover in value is determined by the capacitance of the component coupled to the node 322 and configured to receive CLAMPE_OUT. In at least some examples, a duration of time for the voltage at the node 336 and the voltage at the node 338 to substantially recover is shorter than in circuits implementing an LDO in place of the internal voltage supply described elsewhere herein. For example, in some implementations the duration of time for the voltage at the node 336 and the voltage at the node 338 to substantially recover is an order of magnitude shorter than in circuits implementing an LDO in place of the internal voltage supply, while also consuming less physical surface area than circuits implementing an LDO in place of the internal voltage supply.

Figure 5:
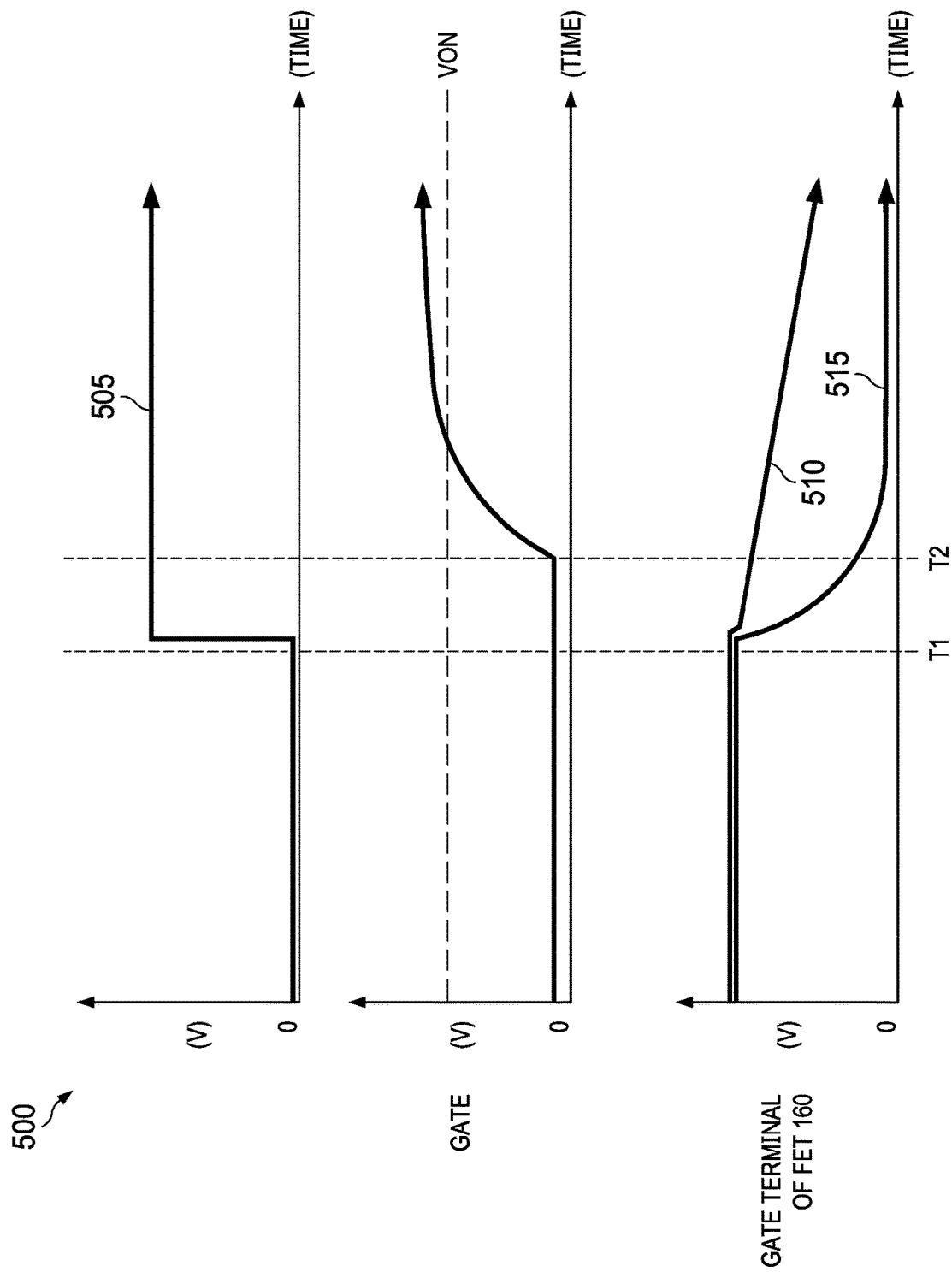
FIG. 5 shows a diagram of illustrative signal waveforms in accordance with various examples.

Turning now to FIG. 5, a diagram 500 of illustrative signal waveforms is shown. In at least some examples, the diagram 500 is representative of signals present in one or more of the system 100 of FIG. 1, circuit 200 of FIG. 2, and/or circuit 300 of FIG. 3. For example, the diagram 500 includes a signal 505, representative of a PWM control signal received by the pull-up circuit 145 and the pull-down circuit 165 (where GATE is pulled up when the signal 505 has a high value and GATE is pulled down when the signal 505 has a low value), GATE of the system 100, a signal 510, representative of a voltage of a signal present at the gate terminal of the FET 160 of the system 100, the node 208 of the circuit 200 and/or the node 322 of the circuit 300 when the external Miller clamp 135 operates without supplement by the internal Miller Clamp 130, and a signal 515, representative of a voltage of a signal present at the gate terminal of the FET 160 of the system 100, the node 208 of the circuit 200 and/or the node 322 of the circuit 300 when the internal Miller Clamp 130 supplements operation of the external Miller clamp 135. As shown in the diagram 500, each signal is represented along a vertical axis representative of voltage and a horizontal axis representative of time.

As shown by the diagram 500, at a time t1 the signal 505 transitions from a logical low value to a logical high value and signals 510 and 515 begin to decrease in value. In at least some examples, the signal 515 decreases in value more rapidly because of the external Miller Clamp 135 and the internal Miller Clamp 130 operating in parallel, as opposed to only the external Miller Clamp 135, and not the internal Miller Clamp 130, operating to generate the signal 510. As further shown, at a time t2, GATE begins to charge. As illustrated by the diagram 500, at the time t2, the signal 515 has a value much closer to zero than the signal 510, and at a point that GATE reaches Von in value, the signal 515 has a value of approximately zero while the signal 510 has a non-zero value. The non-zero value of the signal 510 at the time t2 indicates that, in at least some examples of the system 100, circuit 200, and/or circuit 300, a shoot-through path is formed at the time t2 when the external Miller Clamp 135 operates without supplement of the internal Miller Clamp 130. In contrast, the approximately zero value of the signal 515 at the time t2 indicates that, in at least some examples of the system 100, circuit 200, and/or circuit 300, a shoot-through path is not formed at the time t2 because of the external Miller Clamp 135 operating in parallel with the internal Miller Clamp 130 to more rapidly discharge the gate terminal of the FET 160 of the system 100, the node 208 of the circuit 200 and/or the node 322 of the circuit 300.

Figure 6:
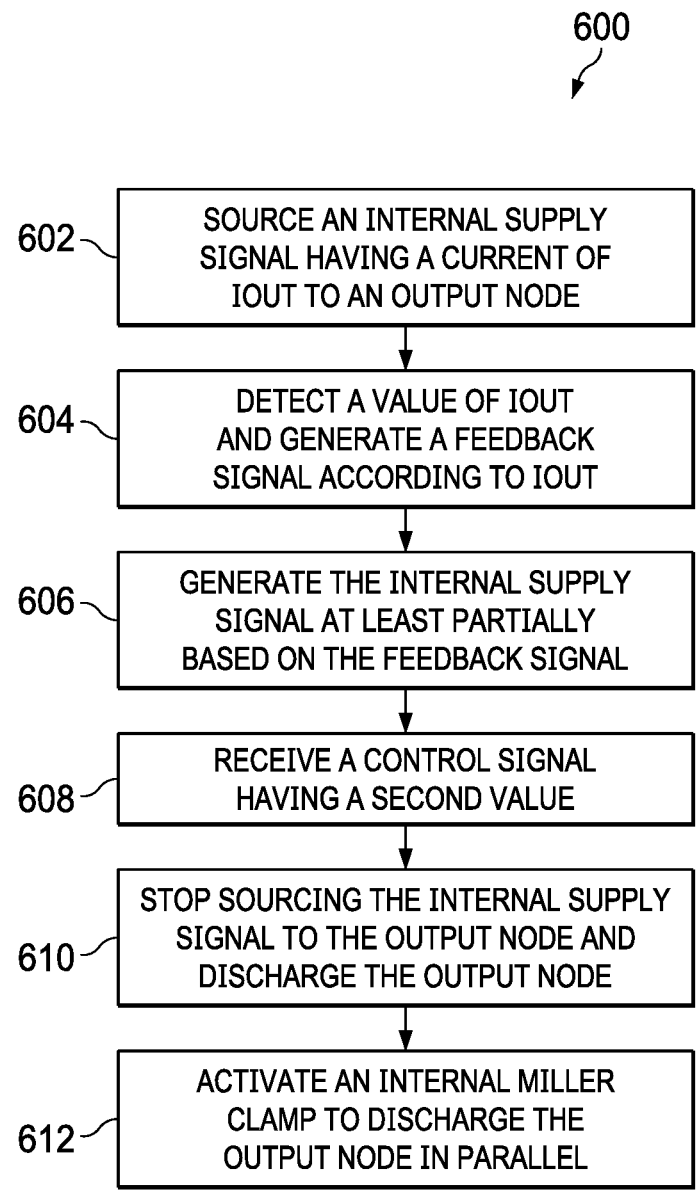
FIG. 6 shows a flowchart of an illustrative method in accordance with various examples.

Turning now to FIG. 6, a flowchart of an illustrative method 600 is shown. In at least some examples, the method 600 is a method for control of a circuit, such as an external Miller Clamp. For example, at least some implementations of the system 100 of FIG. 1, circuit 200 of FIG. 2, and/or circuit 300 of FIG. 3 are configured to implement at least a portion of the method 600.

At operation 602, an internal supply signal having a current of IOUT is sourced to an output node. IOUT is sourced to the output node, in at least some examples, in response to receipt of a control signal having a first value. In at least some examples, the control signal is generated according to a comparison between a value of an output signal of a circuit and a threshold value. The output signal is, in some examples, an output signal of a driver coupled to, and configured to drive, a gate terminal of a power FET or an IGBT. The power FET is, in some examples, a SiC FET. In at least some examples, IOUT is sourced to the output node when the control signal indicates that the value of the output signal is less than the threshold voltage.

At operation 604, a value of IOUT is detected and a feedback signal is generated according to IOUT. In at least some examples, IOUT is detected by a sense component. In some examples, the sense component is a sense FET. In at least some examples, an amount of current having a relationship to IOUT flows through the sense FET. For example, a proportional amount of current to IOUT flows through the sense FET, where the proportional amount is determined according to a channel size ratio between the sense FET and a FET through which IOUT flows. In at least some examples, the current flowing through the sense FET is used as the feedback signal. In other examples, the current flowing through the sense FET is mirrored to generate the feedback signal. In at least some examples, the mirroring further modifies a value of the feedback signal with respect to IOUT and/or the current flowing through the sense FET. For example, the mirroring scales a value of the feedback signal with respect to both IOUT and the current flowing through the sense FET such that the current flowing through the sense FET is proportional, but not equal, to IOUT, and the feedback signal is proportional, but not equal, to the current flowing through the sense FET. In other examples, the mirroring does not modify the value of the feedback signal with respect to the current flowing through the sense FET.

At operation 606, the internal supply signal is generated at least partially based on the feedback signal. The internal supply signal is generated, in some examples, via a circuit other than an LDO. For example, the internal supply signal is generated by an internal voltage supply modulating a reference voltage based on the feedback signal. The internal voltage supply modulates the reference voltage based on the feedback signal, in some examples, by implementing a level-shifter configured to shift a value of the reference voltage based on the feedback signal to generate the internal supply signal such that a drive strength and output voltage of the level-shifter is determined according to the modulated reference voltage.

At operation 608, the control signal is received having a second value. The second value is, in some examples, logically different that the first value such that if the control signal having the first value indicated the output signal being less in value than the threshold value, the control signal having the second value indicates the output signal being greater in value than the threshold value.

At operation 610, the internal supply signal is no longer sourced to the output node and the output node is discharged in response to receipt of the control signal having the second value.

At operation 612, an internal Miller Clamp is activated to operate in parallel to discharge the output node. In at least some examples, the internal Miller Clamp operates in parallel to discharge the output node to increase a pull-down strength present at the output node to decrease a duration of time consumed in discharging the output node. In some examples, operation of the internal Miller clamp in parallel prevents formation of a shoot-through current path in a device in which the shoot-through current path would otherwise be formed in the absence of the parallel operation of the internal Miller Clamp.

While the operations of the method 600 have been discussed and labeled with numerical reference, in various examples the method 600 includes additional operations that are not recited herein (e.g., such as intermediary comparisons, logical operations, output selections such as via a multiplexer, etc.), in some examples any one or more of the operations recited herein include one or more sub-operations (e.g., such as intermediary comparisons, logical operations, output selections such as via a multiplexer, etc.), in some examples any one or more of the operations recited herein is omitted, and/or in some examples any one or more of the operations recited herein is performed in an order other than that presented herein (e.g., in a reverse order, substantially simultaneously, overlapping, etc.), all of which is intended to fall within the scope of the present disclosure.

In the foregoing discussion, the terms "including" and "comprising" are used in an open-ended fashion, and thus should be interpreted to mean "including, but not limited to . . . " The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A. A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device that is said to include certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be configured to couple to at least some of the passive elements and/or the sources to form the described structure either at a time of manufacture or after a time of manufacture, for example, by an end-user and/or a third-party.

While certain components are described herein as being of a particular process technology (e.g., FET, MOSFET, n-type, p-type, etc.), these components may be exchanged for components of other process technologies (e.g., replace FET and/or MOSFET with bi-polar junction transistor (BJT), replace n-type with p-type or vice versa, etc.) and reconfiguring circuits including the replaced components to provide desired functionality at least partially similar to functionality available prior to the component replacement. Components illustrated as resistors, unless otherwise stated, are generally representative of any one or more elements coupled in series and/or parallel to provide an amount of impedance represented by the illustrated resistor. Additionally, uses of the phrase "ground voltage potential" in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about", "approximately", or "substantially" preceding a value means +/−10 percent of the stated value.

The above discussion is meant to be illustrative of the principles and various examples of the present disclosure. Numerous variations and modifications will become apparent to those skilled in the art once the above disclosure is fully appreciated. It is intended that the present disclosure be interpreted to embrace all such variations and modifications.

What is claimed is:

1. A circuit, comprising:
   a voltage supply comprising an input terminal and an output terminal;
   a driver circuit comprising:
      a first input terminal coupled to the output terminal of the voltage supply;
      a second input terminal;
      an output terminal;
      a first p-type field-effect transistor (FET) comprising:
         a gate terminal;
         a source terminal coupled to the output terminal of the voltage supply; and
         a drain terminal coupled to the output terminal of the driver circuit; and
      a first n-type FET comprising:
         a gate terminal;
         a drain terminal coupled to the output terminal of the driver circuit and to the drain terminal of the first p-type FET; and
         a source terminal coupled to a ground terminal;
   a Miller Clamp coupled between the output terminal of the driver circuit and
      the ground terminal; and
   a feedback bias circuit comprising:
      an input terminal coupled to the output terminal of the driver circuit: and
      an output terminal coupled to the input terminal of the voltage supply.

2. The circuit of claim 1, wherein the voltage supply comprises:

a current source comprising a first terminal and a second terminal;
a second n-type FET comprising:
  a gate terminal coupled to the first terminal of the current source;
  a drain terminal coupled to the second terminal of the current source; and
  a source terminal;
a third n-type FET comprising:
  a gate terminal coupled to the first terminal of the current source;
  a drain terminal coupled to the first terminal of the current source; and
  a source terminal;
a voltage source comprising:
  a first terminal coupled to the source terminal of the third n-type FET; and
  a second terminal coupled to the ground terminal;
a resistor coupled between the source terminal of the second n-type FET and the ground terminal; and
a capacitor coupled between the source terminal of the second n-type FET and the ground terminal.

3. The circuit of claim 1, wherein the driver circuit further comprises:
a first driver comprising:
  an input terminal coupled to the second input terminal of the driver circuit;
  an output terminal; and
  a supply terminal coupled to the output terminal of the voltage supply; and
a second driver comprising:
  an input terminal;
  an output terminal; and
  a supply terminal coupled to the output terminal of the voltage supply.

4. The circuit of claim 1, wherein the feedback bias circuit comprises:
a second p-type FET comprises:
  a gate terminal coupled to the driver circuit;
  a drain terminal coupled to the output terminal of the driver circuit; and
  a source terminal;
a fourth n-type FET comprising;
  a gate terminal coupled to the input terminal of the voltage supply;
  a source terminal coupled to the source terminal of the second p-type FET; and
  a drain terminal;
a third p-type FET comprising:
  a gate terminal coupled to the drain terminal of the fourth n-type FET;
  a drain terminal coupled to the drain terminal of the fourth n-type FET; and
  a source terminal; and
a fourth p-type FET comprising:
  a gate terminal coupled to the drain terminal of the fourth n-type FET;
  a drain terminal coupled to the input terminal of the voltage supply; and
  a source terminal coupled to the source terminal of the third p-type FET.

5. The circuit of claim 1, wherein the voltage supply is configured to:
generate a reference voltage;
modulate the reference voltage based on an output of the feedback bias circuit to generate an internal supply signal; and
drive the driver circuit with the internal supply signal.

6. The circuit of claim 5, wherein the circuit does not comprise a low dropout regulator (LDO).

7. A circuit, comprising:
a voltage supply configured to generate an internal supply signal according to a reference voltage and a feedback signal, the voltage supply comprising:
  a current source comprising a first terminal and a second terminal;
  a first n-type field-effect transistor (FET) comprising:
    a gate terminal coupled to the first terminal of the current source;
    a drain terminal coupled to the second terminal of the current source, and
    a source terminal;
  a second n-type FET comprising:
    a gate terminal coupled to the first terminal of the current source;
    a drain terminal coupled to the first terminal of the current source; and
    a source terminal;
  a voltage source comprising:
    a first terminal coupled to the source terminal of the second n-type FET; and
    a second terminal coupled to a ground terminal;
  a resistor coupled between the source terminal of the first n-type FET and the ground terminal; and
  a capacitor coupled between the source terminal of the first n-type FET and the ground terminal;
a driver circuit comprising:
  a first input terminal coupled to the source terminal of the first n-type FET; and
  an output terminal, wherein the driver circuit is configured to drive the output terminal of the driver circuit with the internal supply signal in accordance with a control signal; and
a feedback bias circuit configured to detect an output current flowing to the output terminal of the driver circuit and generate the feedback signal according to the output current, the feedback bias circuit comprising:
  an input terminal coupled to the output terminal of the driver circuit; and
  an output terminal coupled to the first terminal of the current source.

8. The circuit of claim 7, wherein the driver circuit comprises:
a first driver comprising:
  an input terminal configured to receive the control signal;
  an output terminal; and
  a supply terminal coupled to the source terminal of the first n-type FET;
a second driver comprising:
  an input terminal configured to receive the control signal;
  an output terminal; and
  a supply terminal coupled to the source terminal of the first n-type FET;
a first p-type FET comprising:
  a gate terminal coupled to the output terminal of the first driver;
  a source terminal coupled to the source terminal of the first n-type FET; and
  a drain terminal coupled to the output terminal of the driver circuit; and a third n-type FET comprising:
  a gate terminal coupled to the output terminal of the second driver,
  a drain terminal coupled to the output terminal of the driver circuit; and
  a source terminal coupled to the ground terminal.

9. The circuit of claim 8, wherein the feedback bias circuit comprises:
  a second p-type FET configured to detect the output current, the second p-type FET comprising:
    a gate terminal coupled to the output terminal of the first driver;
    a drain terminal coupled to the output terminal of the driver circuit; and
    a source terminal;
  a fourth n-type FET comprising:
    a gate terminal coupled to the first terminal of the current source;
    a source terminal coupled to the source terminal of the second p-type FET; and
    a drain terminal;
  a third p-type FET comprising:
    a gate terminal coupled to the drain terminal of the fourth n-type FET;
    a drain terminal coupled to the drain terminal of the fourth n-type FET; and
    a source terminal coupled to the second terminal of the current source; and
  a fourth p-type FET comprising:
    a gate terminal coupled to the drain terminal of the fourth n-type FET;
    a drain terminal coupled to the first terminal of the current source; and
    a source terminal coupled to the second terminal of the current source.

10. The circuit of claim 7, further comprising a Miller Clamp coupled between the output terminal of the driver circuit and the ground terminal.

11. The circuit of claim 7, wherein the voltage supply does not comprise a low dropout regulator (LDO).

12. A system, comprising:
  a transistor comprising a gate terminal; and
  a driver coupled to the transistor, and the driver configured to drive the transistor, the driver comprising:
    an internal Miller Clamp comprising:
      an input terminal; and
      an output terminal coupled to the gate terminal of the transistor through a first resistor;
    a field effect transistor (FET) comprising:
      a drain terminal coupled to the gate terminal of the transistor;
      a source terminal coupled to a ground terminal; and
      a gate terminal coupled to the internal Miller Clamp;
    a pull-up circuit coupled to the gate terminal of the transistor through a second resistor, the pull-up circuit comprising an output terminal;
    a comparison circuit comprising:
      an input terminal coupled to the output terminal of the pull-up circuit; and
      an output terminal coupled to the input terminal of the internal Miller Clamp; and
    an external Miller Clamp comprising:
      an input terminal coupled to the output terminal of the comparison circuit;
      an output terminal coupled to the gate terminal of the FET;
    a voltage supply comprising an input terminal and an output terminal;
    a driver circuit comprising:
      a first input terminal coupled to the output terminal of the voltage supply;
      a second input terminal; and
      an output terminal; and
    a feedback bias circuit comprising:
      an input terminal coupled to the output terminal of the driver circuit; and
      an output terminal coupled to the input terminal of the voltage supply, and wherein the external Miller Clamp does not comprise a low dropout regulator (LDO).

13. The system of claim 12, wherein the transistor is a silicon-carbide (SiC) FET or an insulated gate bi-polar transistor (IGBT).

14. The system of claim 12, further comprising a pull-down circuit coupled to the second input terminal of the driver circuit through a third resistor.

15. The system of claim 12, wherein the voltage supply comprises:
  a current source comprising a first terminal and a second terminal;
  a first n-type FET comprising:
    a gate terminal coupled to the first terminal of the current source;
    a drain terminal coupled to the second terminal of the current source; and
    a source terminal;
  a second n-type FET comprising:
    a gate terminal coupled to the first terminal of the current source;
    a drain terminal coupled to the first terminal of the current source; and
    a source terminal;
  a voltage source comprising:
    a first terminal coupled to the source terminal of the second n-type FET; and
    a second terminal coupled to the ground terminal;
  a fourth resistor coupled between the source terminal of the first n-type FET and the ground terminal; and
  a capacitor coupled between the source terminal of the first n-type FET and the ground terminal.

16. The system of claim 15, wherein the driver circuit comprises:
  a first driver comprising:
    an input terminal coupled to the output terminal of the comparison circuit;
    an output terminal;
    a supply terminal coupled to the source terminal of the first n-type FET;
  a second driver comprising:
    an input terminal coupled to the output terminal of the comparison circuit;
    an output terminal; and
    a supply terminal coupled to the source terminal of the first n-type FET;
  a first p-type FET comprising:
    a gate terminal coupled to the output terminal of the first driver;
    a source terminal coupled to the source terminal of the first n-type FET; and
    a drain terminal coupled to the gate terminal of the FET; and a third n-type FET comprising:
  a gate terminal coupled to the output terminal of the second driver;
  a drain terminal coupled to the second terminal of the current source; and
  a source terminal coupled to the gate terminal of the FET.

17. The system of claim 16, wherein the feedback bias circuit comprises:
  a second p-type FET comprising:
    a gate terminal coupled to the output terminal of the first driver;
    a drain terminal coupled to the gate terminal of the FET; and
    a source terminal;
  a fourth n-type FET comprising:
    a gate terminal coupled to the first terminal of the current source;
    a source terminal coupled to the source terminal of the second p-type FET; and
    a drain terminal;
  a third p-type FET comprising:
    a gate terminal coupled to the drain terminal of the fourth n-type FET;
    a drain terminal coupled to the drain terminal of the fourth n-type FET; and
    a source terminal coupled to the second terminal of the current source; and
  a fourth p-type FET comprising:
    a gate terminal coupled to the drain terminal of the fourth n-type FET;
    a drain terminal coupled to the second terminal of the current source; and
    a source terminal coupled to the second terminal of the current source.

18. The system of claim 12, wherein the voltage supply is configured to:
  generate a reference voltage;
  modulate the reference voltage based on an output of the feedback bias circuit to generate an internal supply signal; and
  drive the driver circuit with the internal supply signal.

19. The system of claim 12, wherein the internal Miller Clamp is configured to sink current from the gate terminal of the transistor in parallel with the external Miller Clamp.

* * * * *